United States Patent
Lung et al.

(10) Patent No.: US 8,850,369 B2
(45) Date of Patent: Sep. 30, 2014

(54) METAL CUT PROCESS FLOW

(75) Inventors: Yuan-Hsiang Lung, Hsinchu (TW);
Kuei-Shun Chen, Hsin-Chu (TW);
Meng-Wei Chen, Taichung (TW);
Chia-Ying Lee, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 155 days.

(21) Appl. No.: 13/451,605

(22) Filed: Apr. 20, 2012

(65) Prior Publication Data

US 2013/0280909 A1     Oct. 24, 2013

(51) Int. Cl.
*G06F 17/50* (2006.01)

(52) U.S. Cl.
USPC ............ 716/55; 716/54; 716/100; 438/585; 438/587; 438/671; 438/761; 257/E21.267

(58) Field of Classification Search
CPC .... G06F 1/36; G06F 7/70441; G06F 7/70433
USPC .......... 716/50–55, 100; 438/585, 587, 671, 438/761; 257/E21.267
See application file for complete search history.

(56) References Cited

U.S. PATENT DOCUMENTS

| | | | | |
|---|---|---|---|---|
| 6,884,715 B1 * | 4/2005 | Kwon et al. | | 438/638 |
| 7,129,159 B2 * | 10/2006 | America et al. | | 438/618 |
| 8,048,764 B2 * | 11/2011 | Huang et al. | | 438/425 |
| 8,563,410 B2 * | 10/2013 | Lin et al. | | 438/585 |
| 2009/0081882 A1 * | 3/2009 | Setta | | 438/761 |

* cited by examiner

*Primary Examiner* — Nghia Doan
(74) *Attorney, Agent, or Firm* — Haynes and Boone, LLP (57) ABSTRACT

A method for optimizing masks used for forming conductive features and a method for creating the mask features on an IC device are disclosed. An exemplary embodiment includes receiving a design database including a plurality of conductive features. First and second features suitable for joining are identified from the plurality of conductive features. A joined feature corresponding to the first and the second features is characterized. A cut shape configured to separate the first and second features from the joined feature is also characterized. The joined feature is categorized into a first conductive mask, the cut shape is categorized into a cut mask, and a third feature is categorized into a second conductive mask. The categorized shapes and features of the first conductive mask, the second conductive mask, and the cut mask are provided for manufacturing a mask set corresponding to the categorized shapes and features.

20 Claims, 11 Drawing Sheets

METAL CUT PROCESS FLOW

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, controlling the formation of conductive features becomes increasingly difficult as size decreases. Conductive layers are frequently formed using metallization processes such as damascene and dual damascene processes. Damascene processes utilize one or more masks to etch openings in an insulating layer of an IC wafer. Typically, photolithography is used to transfer the mask patterns to the wafer. Each photolithographic mask in the set has a pattern formed by transmissive or reflective regions. During exposure, radiation such as ultraviolet light passes through or reflects off the mask before striking a photoresist coating on the wafer. The pattern is thus transferred onto the photoresist, which is then selectively removed to reveal the pattern. The wafer then undergoes processing steps that take advantage of the shape of the remaining photoresist to create cavities in the insulating layer. The openings are filled with a conductive material, such as copper, to form wires, vias, interconnects, and other shapes. With each subsequent improvement in geometry size, additional challenges in metallization arise. Although existing metallization procedures have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to IC device manufacturing and more particularly, to a procedure for optimizing masks used for forming conductive features and to a procedure for forming the conductive features therein.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
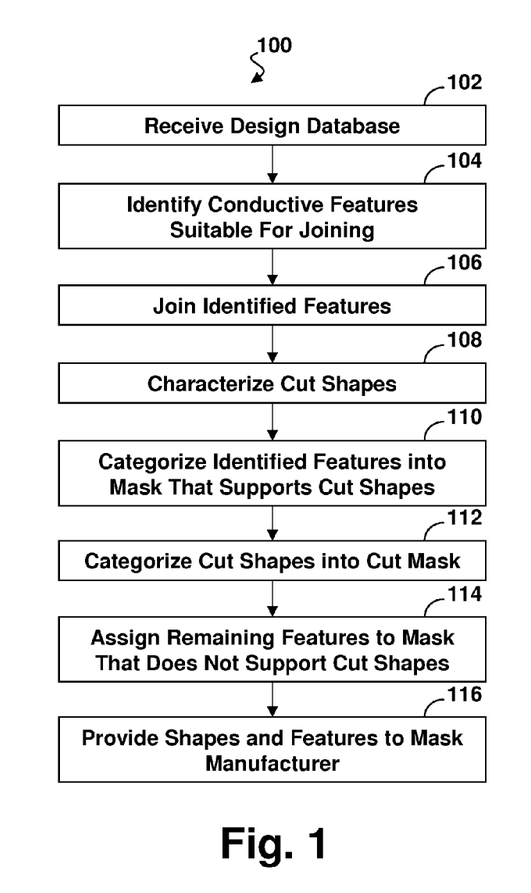
FIG. 1 is a flow diagram of a method for manufacturing an IC device according to aspects of the present disclosure.
Figure 2:
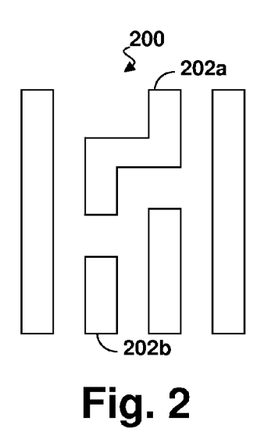
FIGS. 2-4 are illustrations of features within a design database for manufacturing an IC device according to various embodiments of the present disclosure.
Figure 3:
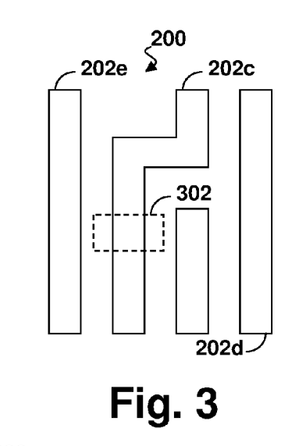
Figure 4:
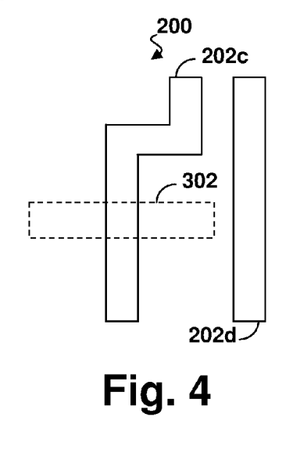

A method 100 for manufacturing an IC device is described with reference made to FIGS. 1-4. FIG. 1 is a flow diagram of the method 100 for manufacturing an IC device according to aspects of the present disclosure. It is understood that additional steps can be provided before, during, and after the method 100, and some of the steps described can be replaced or eliminated for other embodiments of the method. FIGS. 2-4 are illustrations of features within a design database 200 for manufacturing an IC device according to various embodiments of the present disclosure. The method 100 begins at block 102 where the design database 200 is provided or received. The design database 200 contains representations of the IC features in a predetermined design standard such as GDSII or OASIS. Because the design database 200 contains the features as they are intended to be formed, the database can be considered the golden model.

The design database 200 contains a set of conductive features (e.g. conductive features 202a and 202b), information corresponding to conductor shapes, to be formed as part of the IC device. Conductive features are often referred to as metal features. However, conductive features may include pure metals such as copper, tungsten, tin, aluminum, silver, and gold, metal alloys and compounds such as TiN, WN, WNC, TaN, and TaSiN, conductive carbon compounds, polymer conductors, organic conductors, and any other conductive material. Likewise, while the processes for creating conductive structures are often termed metallization, they are equally suitable for forming any conductive structure regardless of material. In an embodiment, the set of conductive features includes conductive features corresponding to a single layer. In an embodiment, the set of conductive features further includes conductive features such as vias corresponding to adjacent layers but, nevertheless, may be formed during the same metallization process.

It has been determined that even though the features are formed on the same layer or during the same process, a single mask may not produce the resolution and fidelity needed for smaller critical dimensions and higher densities. Therefore, conductor shapes for a single layer may be divided into two or more masks. To further improve performance, a third mask, such as a cut mask, may be used. A cut mask defines areas where the conductor is not intended. When a cut mask is employed, conductive features may be integrated or joined to form a larger mask feature. Larger mask features often produce sharper and more uniform IC features. Typically, after the larger feature is formed, the cut mask is used to divide the joined feature into its constituents. Despite the extra time, expense, and complexity of a cut mask, the improved performance often justifies its use. In block 104, conductive features suitable for joining are identified. Referring to FIG. 2, conductive feature 202a and conductive feature 202b are identified as candidates for joining. In block 106, the identified conductive features are joined. In block 108, cut features necessary to separate the joined feature are characterized. For example, in FIG. 3, conductive feature 202c is created and cut shape 302 is defined.

In blocks 110 through 114, the conductive features are categorized into one or more masks. Categorization is performed based on design criteria, which may include feature size, feature shape, feature spacing, proximity to identified structures, manufacturing criteria including processing requirements, and other design criteria. In some embodiments, conductor masks are separated into those that support a given cut mask and those that do not. As will be explained, dividing the conductor masks in this manner allows the use of larger cut mask shapes. For cut masks as well as conductive masks, larger features often produce better results. Manufacturing challenges may be especially pronounced for cut shapes. Small, isolated regions of photoresist, which are typical of cut shapes, may not survive the etching and processing steps, a problem often referred to as the PR (photoresist) island effect. Line end corner rounding caused by optical properties as well as processing properties may render the cut shape too small to separate the conductive features. Overlap issues may also prevent conductor separation. These challenges may be alleviated by designating one or more masks as not supporting the cut mask.

In block 110, conductive features requiring a cut shape are categorized into a mask that supports cut shapes. In block 112, cut shapes are categorized to a cut mask. In block 114, remaining conductive features are assigned to a mask that does not support cut shapes. In one such embodiment, conductive features are categorized into a first conductor mask, the Metal A mask, a second conductor mask, the Metal B mask, and a cut mask, the Cut Mask. Joined features are limited to the Metal A mask. No cut features are permitted for the conductive features in the Metal B mask. In the embodiment depicted in FIG. 3, conductive features 202c and 202d are categorized into the Metal A mask. Conductive feature 202e is categorized into the Metal B mask. Cut shape 302 is categorized into the Cut Mask. Because the Metal B mask does not support and is not affected by the Cut Mask, the dimensions of cut shape 302 may be expanded as shown in FIG. 4, where features categorized into the Metal B mask have been omitted for clarity.

It is understood that categorizing features and shapes into their respective masks may be performed in any order. Furthermore, it is understood that in various embodiments, identifying features for joining, joining such features, and characterizing cut shapes are performed before, during, after categorizing the features and shape, and may be performed a combination of before, during, and after categorizing. In an embodiment, categorizing features and shapes involves running a design rule check. For example, the design rule check may indicate features that cannot be joined, features that must be joined, features that cannot be categorized into the same mask, and may indicate any other design criteria.

In block 116, the categorized shapes are provided to a mask manufacturer for manufacturing the associated masks. The categorized shapes may be provided in any number of design formats. In an embodiment, the design database 200 containing the categorized conductor shapes is provided to the mask manufacturer. In another embodiment, one or more mask databases containing the categorized shapes are provided to the mask manufacturer. In yet another embodiment, the categorized shapes are provided in an alternate design format.

Figure 5:
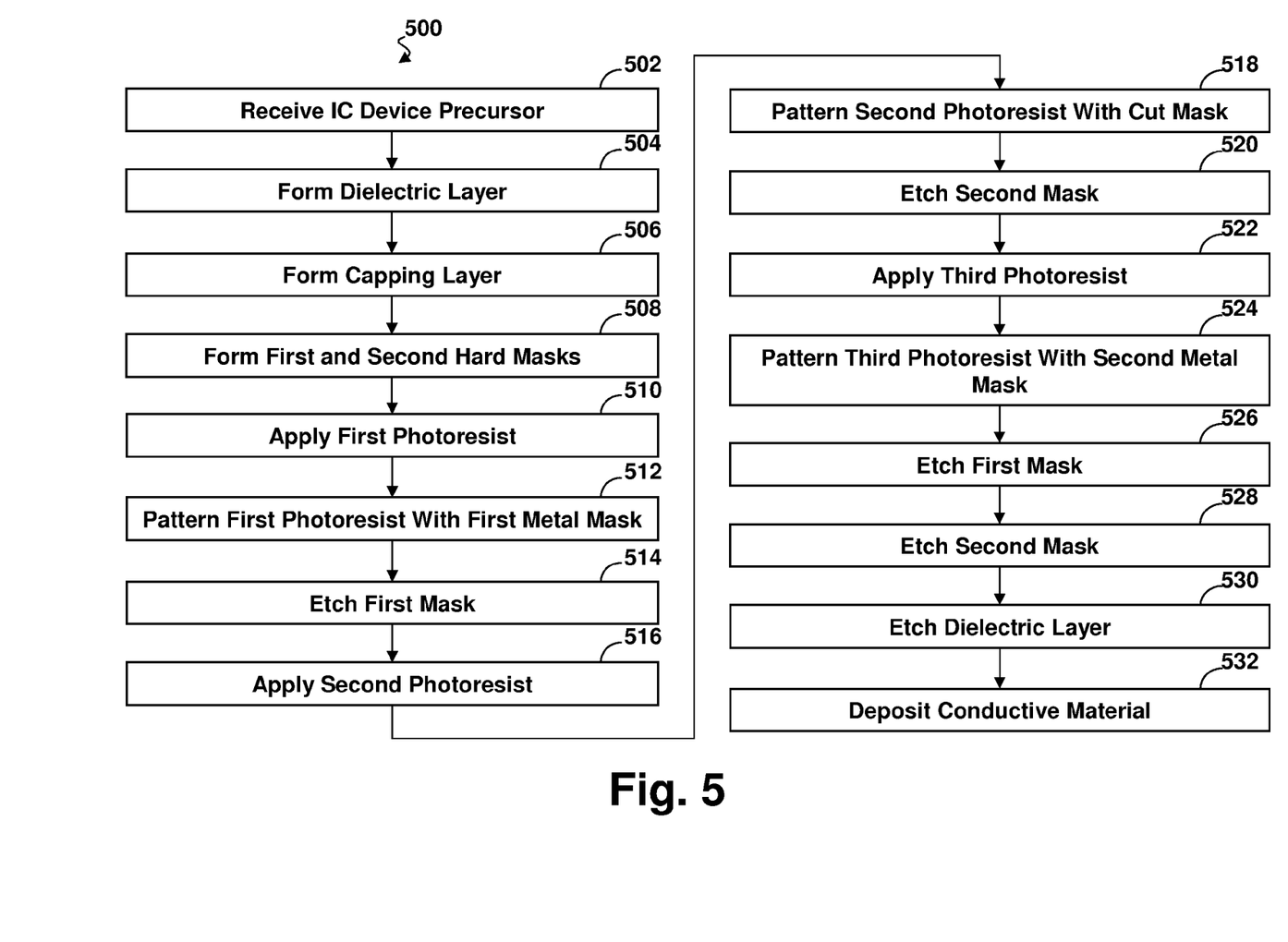
FIG. 5 is a flow diagram of a method of IC device manufacturing according to an embodiment of the present disclosure.
Figure 6A:
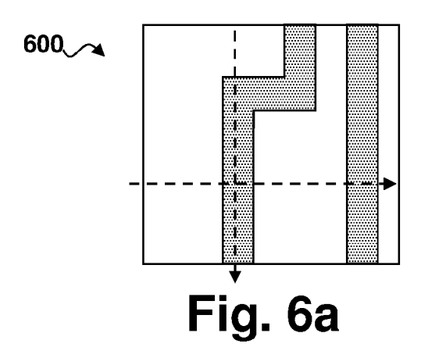
FIGS. 6a, 7a, 8a, 9a, 10a, 11a, 12a, and 13a are top views of an IC device precursor according to various aspects of the present disclosure.
Figure 6B:
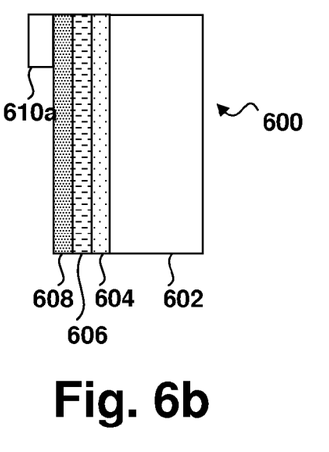
FIGS. 6b, 7b, 8b, 9b, 10b, 11b, 12b, and 13b are sectional views taken along a first axis of an IC device precursor according to various embodiments of the present disclosure.
Figure 6C:
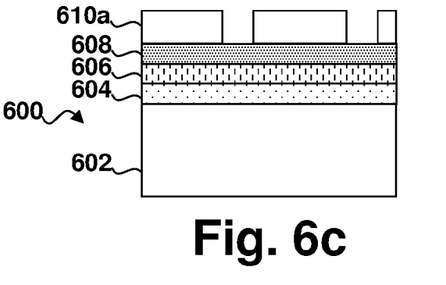
FIGS. 6c, 7c, 8c, 9c, 10c, 11c, 12c, and 13c are sectional views taken along a second axis of an IC device precursor according to various embodiments of the present disclosure.

A method 500 of IC device manufacturing is described with reference made to FIGS. 5-13c. FIG. 5 is a flow diagram of the method 500 of IC device manufacturing according to an embodiment of the present disclosure. It is understood that additional steps can be provided before, during, and after the method 500, and some of the steps described can be replaced or eliminated for other embodiments of the method. FIGS. 6a, 7a, 8a, 9a, 10a, 11a, 12a, and 13a are top views of an IC device precursor 600 according to various embodiments of the present disclosure. FIGS. 6b, 7b, 8b, 9b, 10b, 11b, 12b, and 13b are sectional views taken along a first axis of an IC device precursor 600 according to various embodiments of the present disclosure. FIGS. 6c, 7c, 8c, 9c, 10c, 11c, 12c, and 13c are sectional views taken along a second axis of an IC device precursor 600 according to various embodiments of the present disclosure.

In block 502, an IC device precursor 600 is received or provided. The IC device precursor 600 includes a substrate. The substrate may be a wafer, a semiconductor substrate, or any base material on which processing is conducted to produce layers of material, pattern features, and/or integrated circuits. In the present example, the substrate is a bulk silicon substrate. Alternatively, the semiconductor substrate includes an elementary semiconductor including silicon or germanium in crystal; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure. Alternatively, the substrate may include a non-semiconductor material, such as a glass substrate for thin-film-transistor liquid crystal display (TFT-LCD) devices, or fused quartz or calcium fluoride for a photomask (mask).

Some exemplary substrates include an insulator layer. The insulator layer comprises any suitable material, including silicon oxide, sapphire, other suitable insulating materials, and/or combinations thereof. An exemplary insulator layer may be a buried oxide layer (BOX), oxidation, deposition, and/or other suitable process. In some substrates, the insulator layer is a component (e.g., layer) of a silicon-on-insulator substrate.

The substrate may include various doped regions depending on design requirements as known in the art (e.g., p-type wells or n-type wells). The doped regions may be doped with p-type dopants, such as phosphorus or arsenic, and/or n-type dopants, such as boron or $BF_2$. The doped regions may be formed directly on the substrate, in a P-well structure, in an N-well structure, in a dual-well structure, or using a raised structure. The semiconductor substrate may further include various active regions, such as regions configured for an N-type metal-oxide-semiconductor transistor device (referred to as an NMOS) and regions configured for a P-type metal-oxide-semiconductor transistor device (referred to as a PMOS). It is understood that the IC device precursor 600 may be formed by CMOS technology processing, and thus some processes are not described in detail herein.

The IC device precursor 600 may further include one or more isolation regions on the substrate to isolate various regions of the substrate, for example, to isolate NMOS and PMOS device regions. The isolation regions may utilize isolation technology, such as local oxidation of silicon (LOCOS) or shallow trench isolation (STI), to define and electrically isolate the various regions. The isolation regions can comprise silicon oxide, silicon nitride, silicon oxynitride, other suitable materials, or combinations thereof. The isolation regions can be formed by any suitable process. As one example, the formation of an STI may include a photolithography process, etching a trench in the substrate (for example, by using a dry etching and/or wet etching process), and filling the trench (for example, by using a chemical vapor deposition process) with one or more dielectric materials. The filled trench may have a multi-layer structure such as a thermal oxide liner layer filled with silicon nitride or silicon oxide.

One or more material layers may be formed over the substrate. The one or more material layers are formed over the substrate by any suitable process, including various deposition techniques, such as physical vapor deposition (PVD), chemical vapor deposition (CVD), atomic layer deposition (ALD), plating, other suitable process, and/or combinations thereof. The one or more material layers may be patterned by various processing steps to form devices and/or features on the substrate. For example, the material layers may be patterned to form lines of gate structures (or gate stacks) for a semiconductor device.

The one or more material layers include any suitable layer including interfacial layers, dielectric layers, high-k dielectric layers, gate layers, conductive layers, capping layers, hard mask layers, buffer layers, diffusion/barrier layers, adhesion layers, and/or other suitable layers. In the present embodiment, the one or more material layers include layers for forming a high-k/metal gate structure. In an example, a gate including a gate dielectric layer and polysilicon layer is formed. Other examples are contemplated.

In block 504, a dielectric layer 602 is formed on the substrate. Exemplary materials for the dielectric layer 602 are often classified based upon a dielectric constant and include traditional dielectrics, low-K (LK), extreme low-K (ELK), and/or extra low-k (XLK) materials. It is understood that the classifications are mere examples and that other classifications based on the dielectric constant of the material are contemplated and may be utilized as well. Traditional dielectrics include silicon dioxide. LK, ELK, and/or XLK dielectric materials include materials such as silicon nitride, silicon oxynitride, spin-on glass (SOG), undoped silicate glass (USG), fluorinated silica glass (FSG), carbon doped silicon oxide (e.g., SiCOH), carbon-containing material, Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical of Midland, Mich.), polyimide, other suitable dielectric materials, and/or combinations thereof. The dielectric layer 602 is formed by any suitable technique including spin-on, CVD, PVD, or ALD and may be formed to any suitable depth. In an embodiment, the dielectric layer 602 includes an etch stop layer disposed between the substrate and the dielectric material. The etch stop layer may comprise an oxide material, such as silicon oxide; a nitrogen-containing material, such as silicon nitride or silicon oxynitride, an amorphous carbon material; silicon carbide; tetraethylorthosilicate (TEOS); other suitable materials; and/or combinations thereof.

In the present embodiment, a capping layer 604 is formed on the dielectric layer in block 506. Some dielectrics, particularly those with a lower dielectric constant are porous. The capping layer 604 prevents subsequent layers from infiltrating the dielectric layer 602. Exemplary capping layer 604 materials include polysilicon, silicon-containing materials, germanium-containing materials, other proper materials; and/or combinations thereof. The capping layer 604 is commonly formed using CVD, PVD, and/or ALD, and other suitable techniques may be used.

In block 508, a first hard mask 608 and second hard mask 606 are formed on the dielectric layer 602. The first hard mask 608 and second hard mask 606 may comprise an oxide material, such as silicon oxide; a nitrogen-containing material, such as silicon nitride or silicon oxynitride, an amorphous carbon material; silicon carbide; tetraethylorthosilicate (TEOS); other suitable materials; and/or combinations thereof. In an embodiment, the first hard mask 608 and second hard mask 606 are selectively etchable. That is, it is possible to etch the first hard mask 608 without etching the second hard mask 606 and vice-versa. This may be achieved by selecting different materials to form the first and second hard masks. For example, the first hard mask 608 may be silicon oxide, and the second mask 606 may be silicon nitride, or vice versa. Buffered hydrofluoric acid may be used to selectively etch silicon oxide whereas phosphoric acid may be used to selectively etch silicon nitride. In a further embodiment, the first hard mask 608 and the second hard mask 606 are selectively etchable by modifying an etching process parameter.

A first photoresist 610a is applied in block 510. In block 512 and referring to FIGS. 6a, 6b, and 6c, the first photoresist 610a is patterned using a first conductor mask. Patterning the first photoresist layer 610a may include exposing the first photoresist layer 610a to a pattern through a process such as photolithography, may include performing a post-exposure bake process, and may include developing the first photoresist layer 610a. Patterning may also be implemented or replaced by other proper methods, such as maskless photolithography, electron-beam writing, ion-beam writing, and molecular imprint. In the illustrated embodiment, the first conductor mask is capable of supporting cut shapes. In one such embodiment, the first mask is the Metal A mask.

Figure 7A:
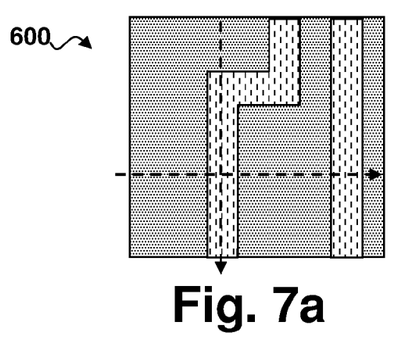
Figure 7B:
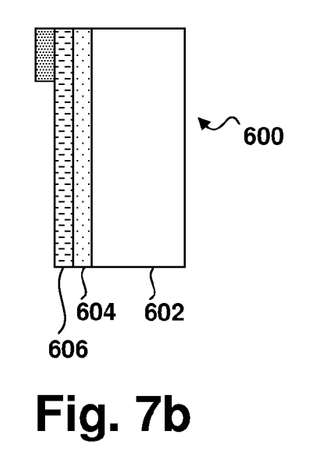
Figure 7C:
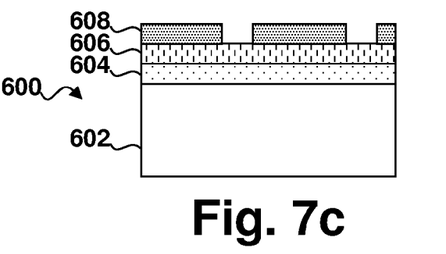

In block 514, the first hard mask 608 is etched. The etching process may include wet etching, dry etching, or a combination thereof and may proceed as a single step or a multiple step etching process. Thereafter, the first photoresist 610a may be removed. FIGS. 7a, 7b, and 7c illustrate the IC device precursor 600 after etching and removing the first photoresist 610a.

Figure 8A:
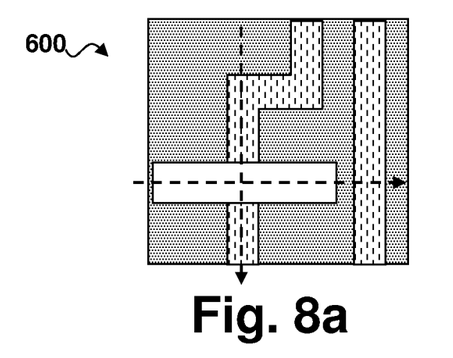
Figure 8B:
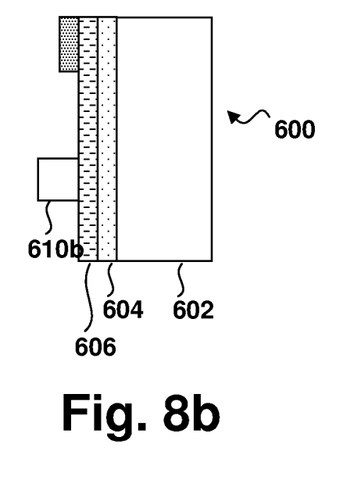
Figure 8C:
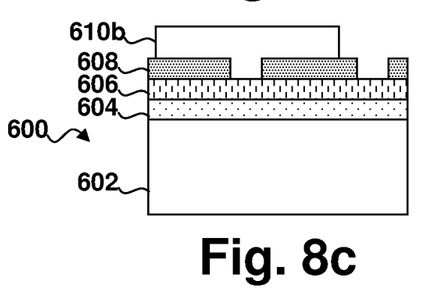
Figure 9A:
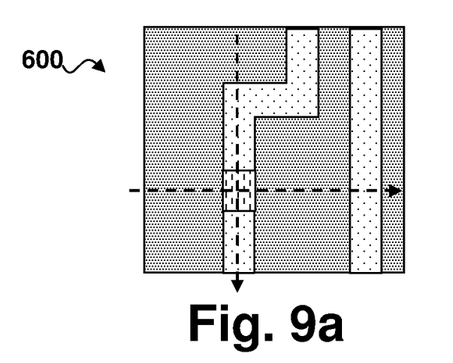
Figure 9B:
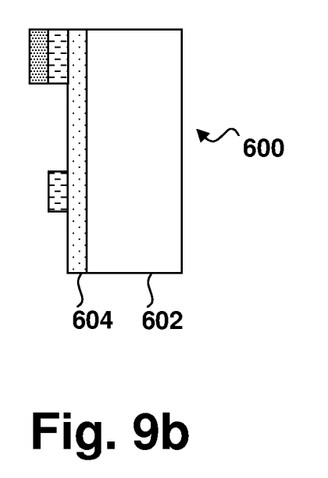
Figure 9C:
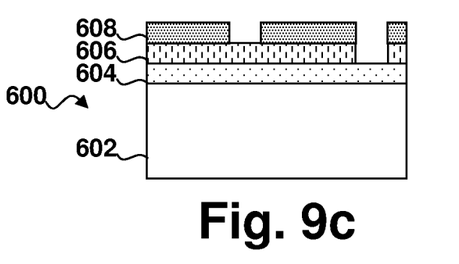

A second photoresist 610b is applied in block 516. In block 518, the second photoresist 610b is patterned using a cut mask as illustrated in FIGS. 8a, 8b, and 8c. In an exemplary embodiment, the cut mask is the Cut Mask. In block 520, the second hard mask 606 is selectively etched. In the embodiment illustrated in FIGS. 9a, 9b, and 9c, the etching process removes areas of the second hard mask 606 not covered by either the photoresist 610b or the first hard mask 608. Thereafter, the second photoresist 610b may be removed.

Figure 10A:
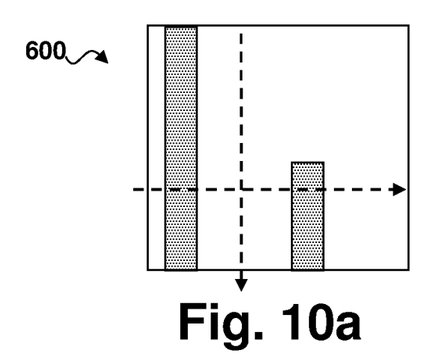
Figure 10B:
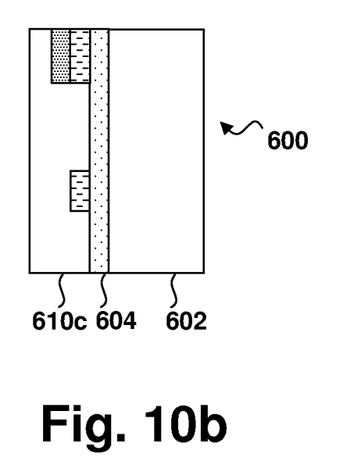
Figure 10C:
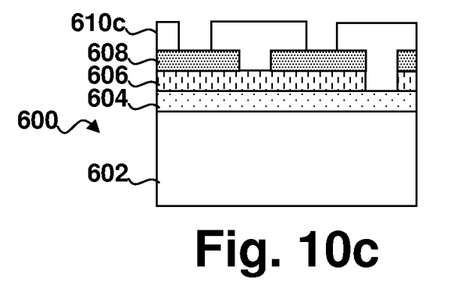
Figure 11A:
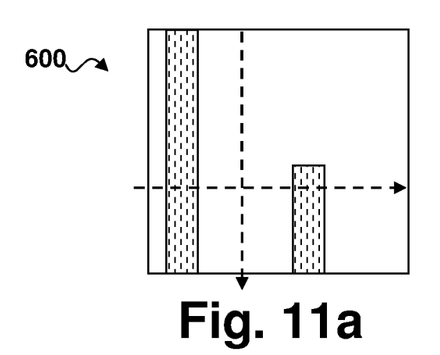
Figure 11B:
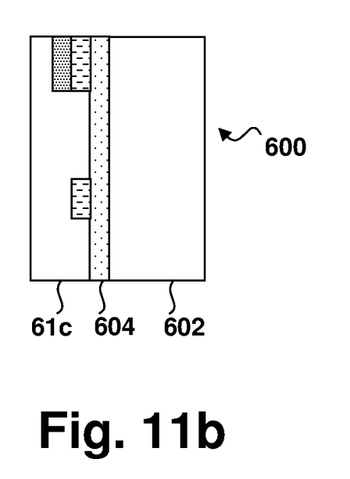
Figure 11C:
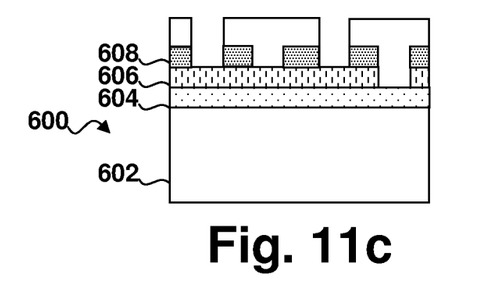
Figure 12A:
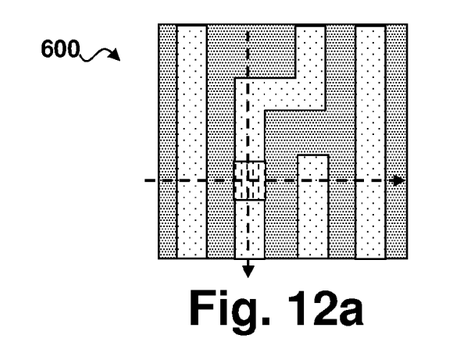
Figure 12B:
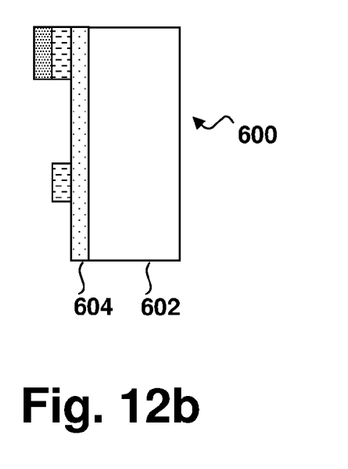
Figure 12C:
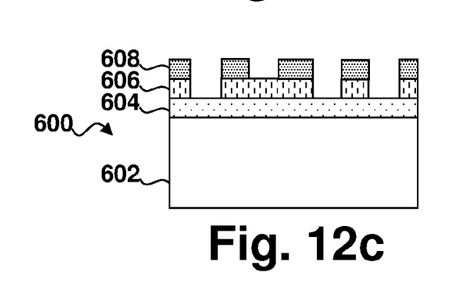

A third photoresist 610c is applied in block 522. In block 524, the third photoresist 610c is patterned using a second conductor mask as illustrated in FIGS. 10a, 10b, and 10c. The second conductor mask does not support cut shapes. In an embodiment, the second mask is the Metal B mask. In FIGS. 11a, 11b, and 11c, the first hard mask 608 is etched in block 526. In block 528, the second hard mask 606 is etched. This may be referred to as a hard mask open process. In an embodiment, etching the first hard mask 608 and etching the second hard mask 606 is performed using two unique etching steps. In an example of such an embodiment, two different etching compounds are used to remove the hard masks. The results of the hard mask open can be seen in FIGS. 12a, 12b, and 12c.

Figure 13A:
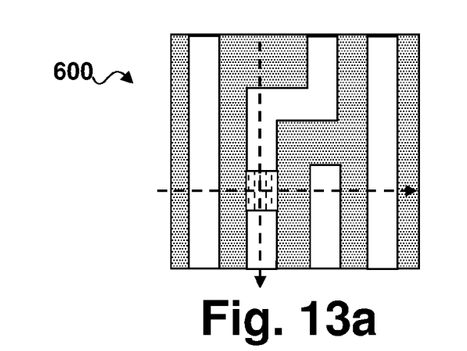
Figure 13B:
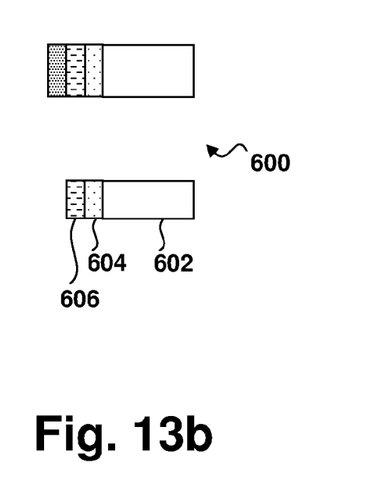
Figure 13C:
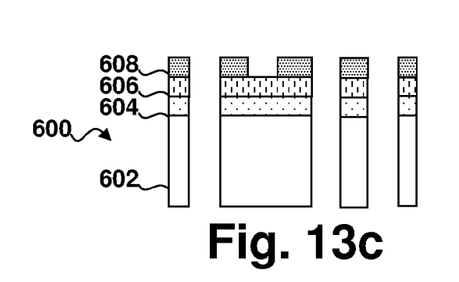

In block 530, the dielectric layer 602 is etched as shown in FIGS. 13a, 13b, and 13c. In an embodiment, etching the dielectric layer 602 includes etching the capping layer 604. In the depicted embodiment, the dielectric layer 602 is etched using the pattern of the second hard mask 606 to form a corresponding pattern in the dielectric layer 602. Commonly the third photoresist 610c layer is removed prior to etching the dielectric layer. In block 532, the conductive material is applied. Exemplary conductive materials include pure metals such as copper, tungsten, tin, aluminum, silver, and gold, metal compounds such as TiN, WN, WNC, TaN, and TaSiN, conductive carbon compounds, polymer conductors, organic conductors, and any other conductive material. The conductive material is commonly applied by CVD, PVD, ALD, and/or electrodeposition. However, other application methods such as sputtering, laser deposition, and/or electroless deposition are contemplated. Application of the conductive material may include one or more CMP (chemical-mechanical planarization or polishing) processes.

Figure 14:
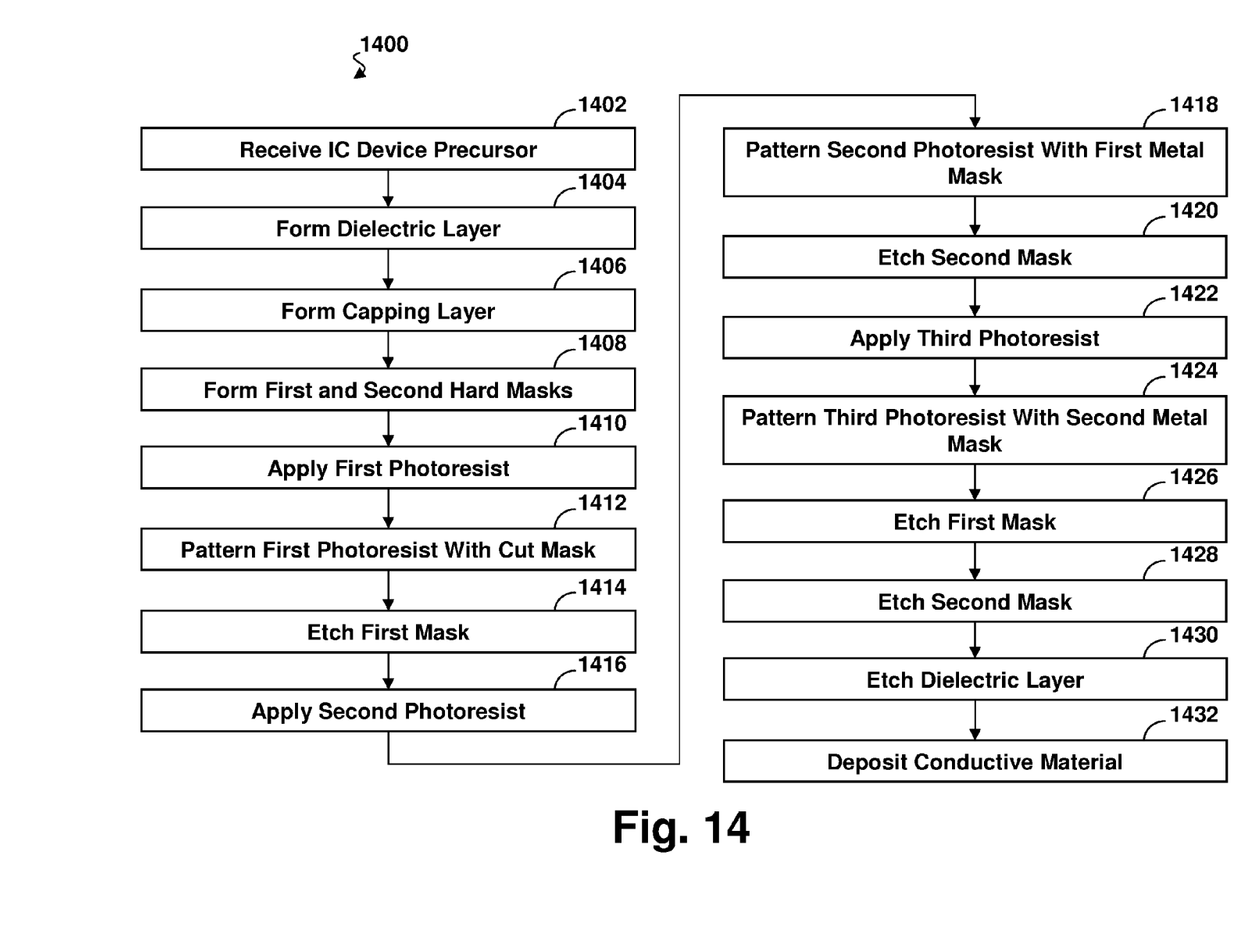
FIG. 14 is a flow diagram of a method of IC device manufacturing according to an embodiment of the present disclosure.
Figure 15A:
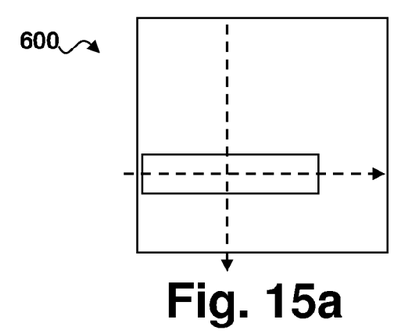
FIGS. 15a, 16a, 17a, 18a, 19a, 20a, 21a, and 22a are top views of an IC device precursor according to various embodiments of the present disclosure.
Figure 15B:
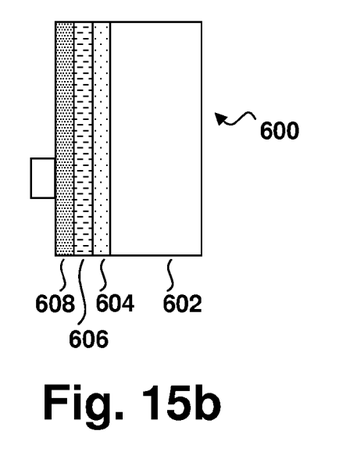
FIGS. 15b, 16b, 17b, 18b, 19b, 20b, 21b, and 22b are sectional views of an IC device precursor taken along a first axis according to various embodiments of the present disclosure.
Figure 15C:
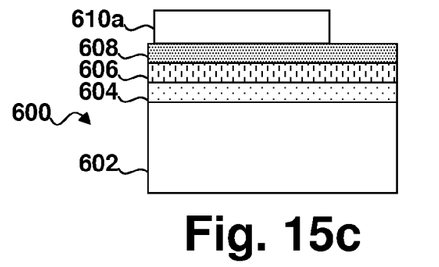
FIGS. 15c, 16c, 17c, 18c, 19c, 20c, 21c, and 22c are sectional views of an IC device precursor taken along a second according to various embodiments of the present disclosure.

A further method 1400 of IC device manufacturing is described with reference made to FIGS. 14-22c. FIG. 14 is a flow diagram of the method 1400 of IC device manufacturing according to an embodiment of the present disclosure. It is understood that additional steps can be provided before, during, and after the method 1400, and some of the steps described can be replaced or eliminated for other embodiments of the method. FIGS. 15a, 16a, 17a, 18a, 19a, 20a, 21a, and 22a are top views of an IC device precursor 600 according to various embodiments of the present disclosure. FIGS. 15b, 16b, 17b, 18b, 19b, 20b, 21b, and 22b are sectional views of an IC device precursor 600 taken along a first axis according to various embodiments of the present disclosure. FIGS. 15c, 16c, 17c, 18c, 19c, 20c, 21c, and 22c are sectional views of an IC device precursor 600 taken along a second axis according to various embodiments of the present disclosure.

In block 1402, an IC device precursor 600 is received or provided. The IC device precursor 600 includes a substrate and may include one or more material layers including interfacial layers, dielectric layers, high-k dielectric layers, gate layers, conductive layers, capping layers, hard mask layers, buffer layers, diffusion/barrier layers, adhesion layers, and/or other suitable layers. In block 1404, a dielectric layer 602 is formed on the substrate. In an embodiment, the dielectric layer 602 includes an etch stop layer disposed between the substrate and the dielectric material. In the present embodiment, a capping layer 604 is formed on the dielectric layer in block 1406.

Figure 16A:
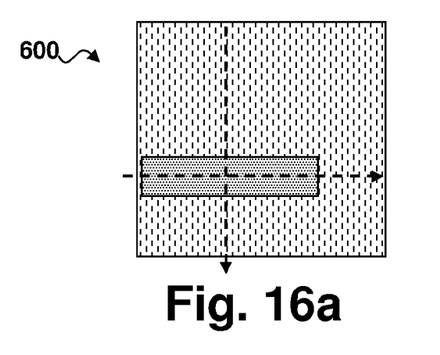
Figure 16B:
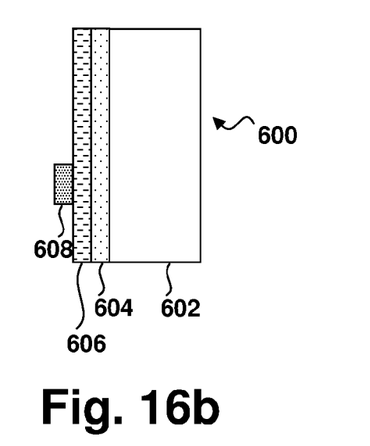
Figure 16C:
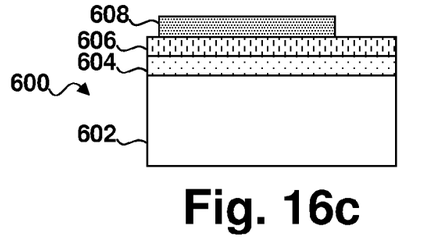
Figure 17A:
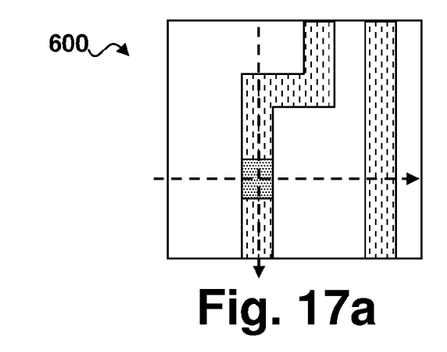
Figure 17B:
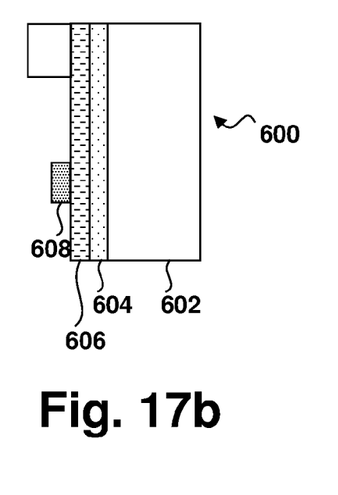
Figure 17C:
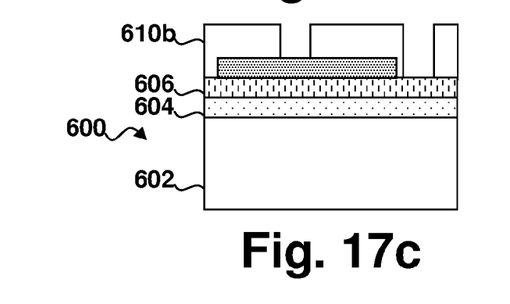

In block 1408, a first hard mask 608 and second hard mask 606 are formed on the dielectric layer 602. In an embodiment, the first hard mask 608 and second hard mask 606 are selectively etchable. A first photoresist 610a is applied in block 1410. In block 1412 and FIGS. 15a, 15b, and 15c, the first photoresist 610a is patterned using a cut mask. In an embodiment, the cut mask is the Cut Mask. In block 1414, the first hard mask 608 is etched. Thereafter, the first photoresist 610a may be removed as depicted in FIGS. 16a, 16b, and 16c.

Figure 18A:
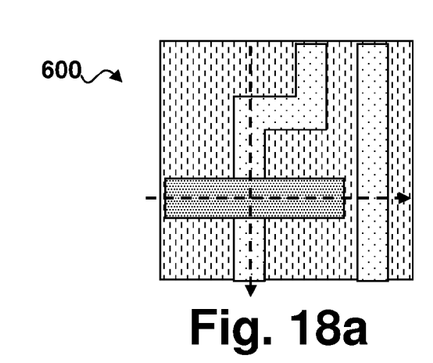
Figure 18B:
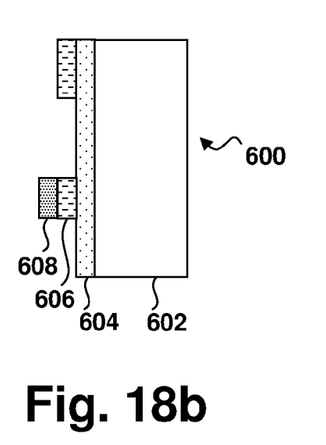
Figure 18C:
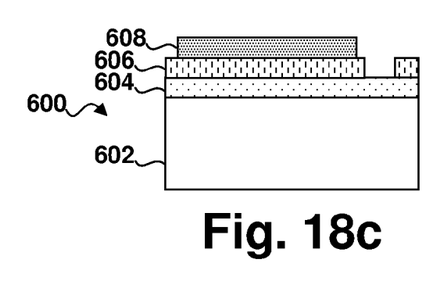

A second photoresist 610b is applied in block 1416. In block 1418 and FIGS. 17a, 17b, and 17c, the second photoresist 610b is patterned using a first conductor mask. The first conductor mask is capable of utilizing cut shapes. In an embodiment, the first mask is the Metal A mask. In block 1420, the second hard mask 606 is selectively etched. In the embodiment depicted in FIGS. 18a, 18b, and 18c, areas of the second hard mask 606 not covered by the photoresist 610b or the first hard mask 608 are etched.

Figure 19A:
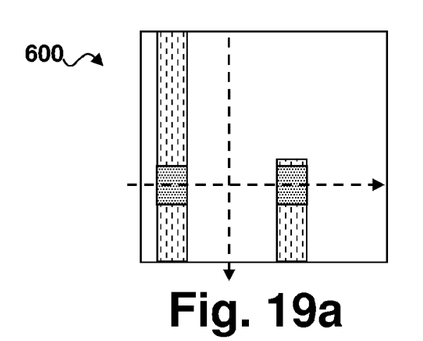
Figure 19B:
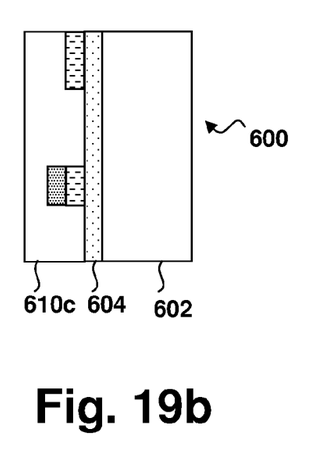
Figure 19C:
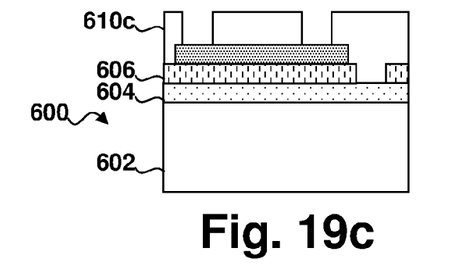
Figure 20A:
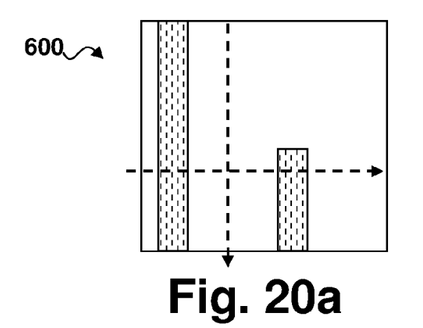
Figure 20B:
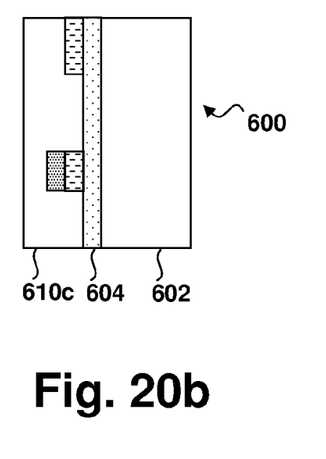
Figure 20C:
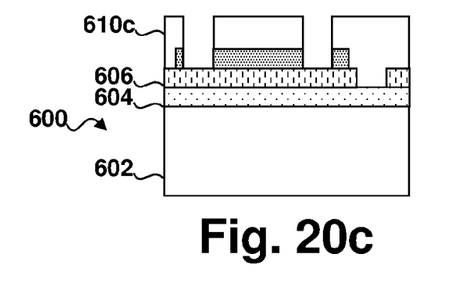
Figure 21A:
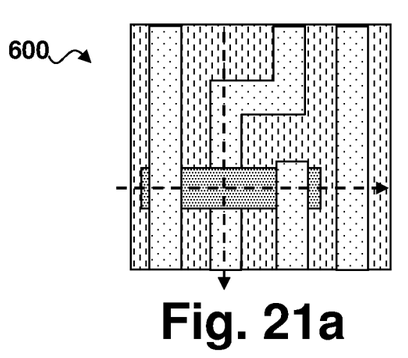
Figure 21B:
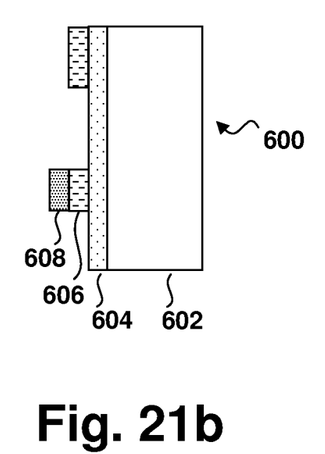
Figure 21C:
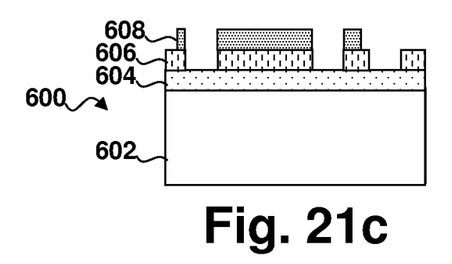
Figure 22A:
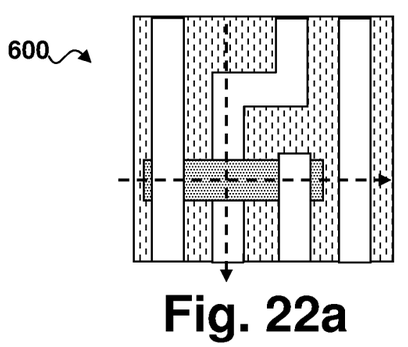
Figure 22B:
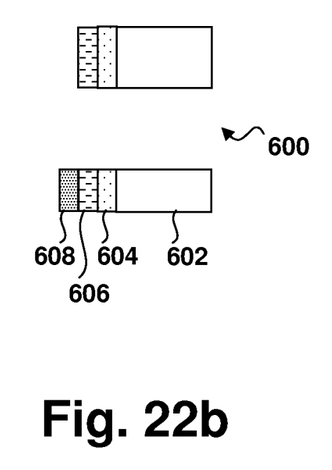
Figure 22C:
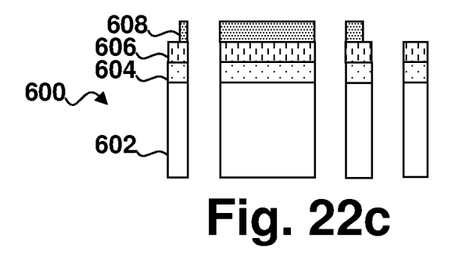

A third photoresist 610c is applied in block 1422. In block 1424, the third photoresist 610c is patterned using a second conductor mask as illustrated in FIGS. 19a, 19b, and 19c. The second conductor mask does not support cut shapes. In an embodiment, the second mask is the Metal B mask. Referring to block 1426 and FIGS. 20a, 20b, and 20c, the first hard mask 608 is etched. In block 1428 and FIGS. 21a, 21b, and 21c, the second hard mask 606 is etched. In an embodiment, etching the first hard mask 608 and etching the second hard mask 606 is performed using two unique etching steps. In an example of such an embodiment, two different etching compounds are used to remove the hard masks. In block 1430, the dielectric layer 602 is etched as shown in FIGS. 22a, 22b, and 22c. Commonly, the third photoresist 610c is removed prior to etching the dielectric layer. In an embodiment, etching the dielectric layer 602 includes etching the capping layer 604. In the depicted embodiment, the dielectric layer 602 is etched using the pattern of the second hard mask 606 to form a corresponding pattern in the dielectric layer 602. In block 1432, the conductive material is applied. Application of the conductive material may include one or more CMP (chemical-mechanical planarization or polishing) processes.

Thus, the present invention provides a procedure for optimizing masks used for forming conductive features and a procedure for creating the mask features on an IC device. In one embodiment, the method comprises: receiving a design database including a plurality of conductive features; identifying a first and a second feature of the plurality of conductive features, wherein the first and second features are suitable for joining; characterizing a joined feature corresponding to the first and the second features; characterizing a cut shape corresponding to the joined feature and configured to separate the first and second features from the joined feature; categorizing the joined feature into a first conductive mask; categorizing the cut shape into a cut mask; categorizing a third feature of the plurality of conductive features into a second conductive mask; and providing the categorized shapes and features of the first conductive mask, the second conductive mask, and the cut mask for manufacturing a mask set corresponding to the categorized shapes and features.

In a further embodiment, the method comprises: receiving an IC device precursor; forming a dielectric layer on the IC device precursor; forming a capping layer on the IC device precursor; forming a first and second hard mask layer on the IC device precursor; applying a first pattern to the first hard mask layer using a first mask; applying a pattern to the second hard mask layer using the first pattern of the first hard mask layer and a second mask to define a first set of conductive features; applying a second pattern to the first hard mask layer using a third mask; applying a pattern to the second hard mask layer using the second pattern of the first hard mask layer to define a second set of conductive features; etching the dielectric layer using the second hard mask layer; and depositing a conductive material to form the first and second sets of conductive features.

In yet another embodiment, the method comprises: receiving an IC device precursor; forming a dielectric layer on the IC device precursor; forming a capping layer on the IC device precursor; forming a first and second hard mask layer on the IC device precursor; applying a first photoresist to the IC device precursor; applying a pattern to the first photoresist using a first mask; performing a first etching of the first hard mask layer using the first patterned photoresist; applying a second photoresist to the IC device precursor; applying a pattern to the second photoresist using a second mask; etching the second hard mask layer using the second patterned photoresist and the first etching of the first hard mask layer to define a first set of conductive features; applying a third photoresist to the IC device precursor; applying a pattern to the third photoresist using a third mask; performing a second etching of the first hard mask layer using the third patterned photoresist; etching the second hard mask layer using the second etching of the first hard mask layer in order to define a second set of conductive features; etching the dielectric layer using the second hard mask layer; and depositing a conductive material to form the first set of conductive features and the second set of conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an IC device comprising:
receiving an IC device precursor;
forming a dielectric layer on the IC device precursor;
forming a first and second hard mask layer on the dielectric layer, wherein the first hard mask layer is formed above the second hard mask layer;
patterning the first hard mask layer using a first mask to form a first pattern on the first hard mask layer;
patterning the second hard mask layer using the first pattern of the first hard mask layer and a second mask that is different from the first mask to form a second mask pattern that defines a first set of conductive features;
patterning the first hard mask layer using a third mask that is different from both the first mask and the second mask to form a third pattern on the first hard mask layer;
transferring the third mask pattern to the second hard mask layer from the first hard mask layer to define a second set of conductive features;
etching the dielectric layer using the second hard mask layer having the second mask pattern and the third mask pattern formed thereupon; and
depositing a conductive material to form the first and second sets of conductive features.

2. The method of claim 1, wherein:
the first mask is a first conductive feature mask;
the second mask is a cut mask, the cut mask including a cut feature; and
the third mask is a second conductive feature mask.

3. The method of claim 2,
wherein the first mask is configured to support the cut feature of the cut mask, and
wherein the second mask is configured not to support the cut feature of the cut mask.

4. The method of claim 1, wherein:
the first mask is a cut mask, the cut mask including a cut feature;
the second mask is a first conductive feature mask; and
the third mask is a second conductive feature mask.

5. The method of claim 4,
wherein the first mask is configured to support the cut feature of the cut mask, and
wherein the second mask is configured not to support the cut feature of the cut mask.

6. The method of claim 1, wherein the first hard mask layer and the second hard mask layer are selectively etchable.

7. The method of claim 1, wherein the method further comprises performing a chemical-mechanical planarization process following depositing the conductive material.

8. The method of claim 1, wherein the conductive material includes one of copper, tungsten, tin, aluminum, silver, gold, TiN, WN, WNC, TaN, and TaSiN.

9. The method of claim 1, wherein the patterning of the first hard mask layer using the first mask includes:
applying a first photoresist to the IC device precursor;
patterning the first photoresist using the first mask; and
performing a first etching of the first hard mask layer using the first patterned photoresist.

10. The method of claim 9, wherein the patterning of the second hard mask layer using the first pattern of the first hard mask layer and the second mask includes:
applying a second photoresist to the IC device precursor;
patterning the second photoresist using the second mask; and
etching a portion of the second hard mask layer exposed by the second patterned photoresist and the first etching of the first hard mask layer to define the first set of conductive features.

11. The method of claim 1, wherein the patterning of the first hard mask layer using the third mask includes:
applying a photoresist to the IC device precursor;
patterning the photoresist using the third mask; and
performing an etching of the first hard mask layer using the patterned photoresist; and
wherein the transferring of the third mask pattern to the second hard mask layer includes etching a portion of the second hard mask layer exposed by the etching of the first hard mask layer to define the second set of conductive features.

12. A method comprising:
receiving a substrate including a material layer;
forming a first hard mask layer on the substrate and a second hard mask layer on the first hard mask layer;
patterning the first hard mask layer according to a first mask selected from: a first conductor-defining mask and a cut-defining mask;
forming a photoresist material on the first mask layer and within a recess formed by the patterning of the first hard mask layer according to the first mask;
patterning the photoresist material according to a second mask selected from: the first conductor-defining mask and the cut-defining mask, wherein the first mask and the second mask are different;
removing a portion of the second hard mask layer exposed by the patterning of the first mask layer according to the first mask and the patterning of the photoresist material according to the second mask;
thereafter patterning the first hard mask layer and the second hard mask layer according to a second conductor-defining mask; and
thereafter etching the material layer using the patterned second hard mask layer.

13. The method of claim 12, wherein the first conductor-defining mask is selected as the first mask and wherein the cut-defining mask is selected as the second mask.

14. The method of claim 12, wherein the cut-defining mask is selected as the first mask and wherein the first conductor-defining mask is selected as the second mask.

15. The method of claim 12 further comprising depositing a conductive material within a cavity formed by the etching of the material layer.

16. The method of claim 12, wherein the second conductor-defining mask excludes conductor shapes to be cut.

17. The method of claim 12, wherein the photoresist material is a second photoresist, and wherein the patterning of the first hard mask layer according to the first mask includes:
forming a first photoresist on the first hard mask layer;
patterning the first photoresist according to the first mask;
selectively etching the first photoresist using the patterned first photoresist; and
thereafter removing the first photoresist.

18. The method of claim 12, wherein the removing of the portion of the second hard mask layer selectively removes the portion based on the portion being exposed by the first mask layer and the photoresist material.

19. A method comprising:
receiving a substrate including a material layer, a first masking layer disposed on the material layer, and a second masking layer disposed on the first masking layer;
performing a first patterning to selectively remove a portion of the first masking layer according to a first mask;
forming a photoresist on the first masking layer and within a cavity formed by the first patterning;
performing a lithographic process to selectively remove a portion of the photoresist according to a second mask that is different from the first mask;
performing a second patterning to selectively remove a portion of the second masking layer exposed by the patterned first masking layer and the patterned photoresist;
thereafter performing a third patterning to selectively remove a second portion of the first masking layer and the second masking layer according to a third mask that is different from the first mask and the second mask; and
thereafter etching the substrate to transfer a pattern formed on the first masking layer and the second masking layer to the material layer.

20. The method of claim 19, wherein the third mask is free of conductor shapes to be cut.

* * * * *